(12) United States Patent
Kohno et al.

(10) Patent No.: US 6,864,695 B2
(45) Date of Patent: Mar. 8, 2005

(54) SEMICONDUCTOR DEVICE TESTING APPARATUS AND SEMICONDUCTOR DEVICE MANUFACTURING METHOD USING IT

(75) Inventors: Ryuji Kohno, Chiyoda (JP); Hideo Miura, Koshigaya (JP); Masatoshi Kanamaru, Miho (JP); Hiroya Shimizu, Ryuugasaki (JP); Naoto Ban, Sagamihara (JP)

(73) Assignee: Renesas Technology Corp., Tokyo (JP)

( * ) Notice: Subject to any disclaimer, the term of this patent is extended or adjusted under 35 U.S.C. 154(b) by 59 days.

(21) Appl. No.: 09/925,375

(22) Filed: Aug. 10, 2001

(65) Prior Publication Data

US 2002/0033707 A1 Mar. 21, 2002

(30) Foreign Application Priority Data

Sep. 20, 2000 (JP) ........................................ 2000-285817

(51) Int. Cl.[7] .............................................. G01R 31/02
(52) U.S. Cl. ........................................ 324/754; 324/757
(58) Field of Search ................................ 324/750, 754, 324/755, 756, 757, 758, 765, 762, 761

(56) References Cited

U.S. PATENT DOCUMENTS 4,961,052 A   10/1990   Tada et al.

6,531,327 B2 * 3/2003 Kanamaru et al. ............ 438/17

FOREIGN PATENT DOCUMENTS

| JP | 7-7052 | 1/1995 |
|---|---|---|
| JP | 11-094863 | 4/1999 |
| JP | 11-274251 | 10/1999 |
| JP | 2000-171483 | 6/2000 |

OTHER PUBLICATIONS

Korean Patent Office Action dated Feb. 28, 2004.

* cited by examiner

Primary Examiner—Michael Tokar
Assistant Examiner—Trung Q. Nguyen
(74) Attorney, Agent, or Firm—Antonelli, Terry, Stout & Kraus, LLP

(57) ABSTRACT

Since each wiring line is formed on one surface of the associated beam at a prescribed width over the entire length of the beam, the beam has the same sectional shape taken in the width direction at any point along an arbitrary longitudinal direction of the beam. As a result, the second moment of area, which is determined by the shapes of the beam and the wiring line, is uniform. This prevents a problem of the curvature of a beam varying locally when the beam is bent by a prescribed amount due to contact of the probe with a pad of a subject body. This, in turn, prevents local concentration of stress in the beams and thereby prevents breakage of the beam. Therefore, the probe structure can be miniaturized while the strength of the beams is kept at a required level, whereby a semiconductor device testing apparatus capable of accommodating many probes can be realized.

7 Claims, 10 Drawing Sheets

SEMICONDUCTOR DEVICE TESTING APPARATUS AND SEMICONDUCTOR DEVICE MANUFACTURING METHOD USING IT

BACKGROUND OF THE INVENTION

1. Field of the Invention

The present invention relates to a semiconductor device testing apparatus and a semiconductor device manufacturing method using it. In particular, the invention relates to a testing apparatus capable of increasing the efficiency of a test process for a semiconductor device, and to a semiconductor manufacturing method using such a testing apparatus.

2. Description of the Related Art

First, a conventional semiconductor device manufacturing method will be described below.

A semiconductor manufacturing process is generally divided into what is called a pre-process in which many LSIs are formed on each wafer and various test processes are executed on the LSIs, and an assembling process in which each LSI is completed into a final product form. Such a typical manufacturing process will be described with reference to FIG. 15.

FIG. 15 is a flowchart outlining a general manufacturing method of a semiconductor device. The manufacturing method includes five processes: a pre-process, a wafer test, cutting and assembling, burn-in, and a final test. These will be described, in turn, below.

(1) Pre-Process

The pre-process will be described with reference to FIG. 17. FIG. 17 is a perspective view showing a wafer appearance that shows how LSIs are formed on the wafer. The pre-process is a process for forming many LSIs 1b on the surface of a Si wafer 1a having a diameter of about 20 cm or 30 cm, for example. Although the pre-process is subdivided into many processes, they will not be described in detail.

As a result of the execution of the pre-process, hundreds of LSIs 1b are formed on the wafer surface in the case of a memory, for example.

Pads (electrodes) 1c for power, grounding, various signals, etc. are formed and arranged on the surface of each LSI. The pads 1c will be described with reference to FIG. 18.

FIG. 18 is an enlarged perspective view showing an appearance of one of the LSIs 1b shown in FIG. 17. In FIG. 18, each pad 1c is such that part of an interconnection of the LSI 1b is exposed to the outside. Usually, the topmost layer is made of a material containing Al (aluminum) or Au (gold) as a major component. Usually, each side of each pad 1c measures tens of micrometers or one hundred plus several tens of micrometers, and the pads 1c are arranged at a pitch that is also equal to tens of micrometers or one hundred plus several tens of micrometers. If necessary, pad 1c is connected to an external terminal of the semiconductor device at a later assembling stage.

(2) Wafer Test

The wafer test is a process for testing the basic characteristics of each LSI 1b formed on the wafer 1a. Usually, this process is executed in a wafer state, that is, in a state in which each LSI 1b is electrically connected to an external system (i.e., a tester) by bringing probes into contact with prescribed pads 1c of the LSI 1b.

In the wafer test, a judgment as to whether each LSI 1b on the wafer 1a is good or defective and other judgments are made for each LSI 1b, and it is judged whether each LSI 1b should be subjected to the following processes.

The structure of a conventional probe structure that is used in the wafer test will be described with reference to FIG. 16. FIG. 16 is a schematic sectional view of a probe structure that is commonly used conventionally. In this example, in many cases, a probe 10 is configured in such a manner that thin needles made of W (tungsten) or the like are bent, their tips are arranged so that they can be conformed to each pad 1c of a subject LSI 1b, and the other ends are fixed to a wiring board 2 with an adhesive or the like.

A plurality of probes 10 are arranged in the depth direction of the paper of FIG. 16, and each probe 10 is connected to a corresponding line 21 in the printed wiring board 2. By connecting electrodes 22 on the printed wiring board 2 to an external system such as a tester (not shown) and bringing the tips of the probes 10 into contact with the pads 1c of a subject LSI 1b, signal exchange between the LSI 1b and the external system is enabled.

As described above, usually, as many as hundreds of LSIs 1b are formed simultaneously on a single wafer 1a. Therefore, to increase the test efficiency, it is a common procedure that the wafer test is executed simultaneously on a plurality of LSIs 1b on the wafer 1a.

The number of LSIs 1b that can be tested simultaneously is determined based on the geometrical factors of a probe structure that is used for the test and signal processing capabilities of a tester. The geometrical factors of a probe structure refers to how many probes 10 can be accommodated in the probe structure with prescribed accuracy in such a manner that the probes 10 conform to the layout of the pads 1c of a subject LSI 1b.

In the conventional probe structure of the example shown in FIG. 16, the number of LSIs 1b that can be tested simultaneously is at most 32 to 64, because of limitations including the tip positional accuracy, and the arrangement pitch of the probes 10 and the areas that are necessary to fix the other ends of the probes 10.

In view of the above, probe structures that are intended to increase the test efficiency by increasing the number of LSIs 1b that can be tested simultaneously have been disclosed. These probe structures will be described below as prior art relating to the invention.

(First Prior Art Structure Relating to the Invention)

Japanese Patent Laid-Open No. 7052/1995 discloses an electrical characteristics measuring probe structure in which a metal coating for conduction is formed on the surface of each of a plurality of cantilevers made of single-crystal Si, and the cantilevers are held by an insulating board that is formed with a conductive wiring pattern.

(Second Prior Art Structure Relating to the Invention)

Japanese Patent Laid-open No. 274251/1999 discloses another probe structure in which beams and probes are formed in a substrate mainly made of Si, and the probes are electrically connected to secondary electrodes that are provided on a surface opposite to the probe formation surface with wiring through through-holes.

(3) Cutting and Assembling

In the cutting and assembling process, the LSIs 1b on the wafer 1a are cut into individual units, and each LSI 1b is given the structure and form of a semiconductor device product through what is called assembling. In the assembling process each LSI 1b is subjected, when necessary, to bonding to a lead frame, periphery resin sealing, lead frame reshaping, etc.

(4) Burn-In

The burn-in process is a process for rejecting seemingly good products by subjecting semiconductor devices being manufactured to thermal and electrical stresses that are more severe than that which would occur in their use environments and thereby causing latent defective factors to surface. Usually, the burn-in process is executed in such a manner that each semiconductor device formed by the cutting and assembling processing (process (3)) is sealed in a dedicated socket that is so configured that the terminals (leads) are electrically connected to an external tester, and it is left in an atmosphere of about 100–150© for several hours to tens of hours.

(5) Final Test

The final test process is what is called a quality assurance test process for judging whether or not each semiconductor device satisfies prescribed specifications and performance for such items as the frequency. Usually, the final test process is executed in such a manner that each semiconductor device is sealed in a dedicated socket that is similar to the socket used in the above burn-in process.

SUMMARY OF THE INVENTION

Notwithstanding their intention to provide improved probe testers, the above prior art structures have the following problems. The problem in each prior art structure relating to the invention will be described below along with an explanation of these problems.

The problem and an explanation of the first prior art structure (Japanese Patent Laid-Open No. 7052/1995) relating to the invention will be described below.

In this prior art structure, if the intention is to increase the number of probes from the current number, it becomes difficult to secure the area where each wiring line is to be formed.

The reason for this will now be discussed. To reach the secondary electrodes starting from the probes (projections) of the beams, the wiring needs to go across the surface (front surface) where the probes are formed and be developed on a peripheral side surface of the probe formation substrate (e.g., a single-crystal Si substrate). It is necessary to avoid crossing other intermediate wirings and devices.

For the above reason, to increase the number of probes, it is necessary that the wiring starting from the probes of the beams goes across the surface (back surface) where no probes of the beams are formed and finally reaches the secondary electrodes, as is the case in the second prior art structure.

The problem and an explanation of the second prior art structure (Japanese Patent Laid-open No. 274251/1999) relating to the invention will be described below.

In this second prior art structure, when a probe is brought into contact with a certain pad 1c of the subject LSI 1b and the beam is bent, the portion of the beam where no wiring line exists is bent more than the other portion, and the beam stress of this portion may become unduly strong. In the worst case, the beam is damaged.

The reason will now be explained. Since the wiring extends from the probe (projection) formation surfaces of the beams to the opposite surfaces of the probe formation substrate (e.g., a Si substrate) via the through-holes that are formed in the probe formation substrate, more probes can easily be formed than in the first prior art structure. However, each double-support beam may have a portion where no wiring line exists on the probe formation surface. Therefore, as previously mentioned, when a probe is brought into contact with a certain pad 1c of the subject LSI 1b and the beam is bent, the portion of the beam where no wiring line exists is bent more than the other portion, and the beam stress of this portion may become unduly strong there. In the worst case, the beam is damaged.

The above phenomenon is more prone to occur in a case where the pads 1c of the subject LSI 1b are arranged densely, that is, the arrangement pitch of the pads 1c is very small.

Another problem and an explanation of the second prior art structure relating to the invention will be described below.

In the second prior art structure relating to the invention, as described above, the wiring extends from the probe formation surface to the opposite surfaces via the through-holes that are formed in the probe formation substrate in advance. The through-holes are formed in substantially the same plane as the secondary electrode (named ô▸pads 121ö in the publication) formation surface. Therefore, if a sufficient area is not secured in the secondary electrode formation surface due to the size of the subject LSI 1b and the layout of the pads 1c, there may occur a case in which the through-holes occupy a large part of the secondary electrode formation surface and, as a result, the secondary electrodes cannot be formed so as to have a sufficiently large pitch and area.

An object of the present invention is to provide a semiconductor device testing apparatus that can be miniaturized while the strength of beams is kept at a required level and that hence can accommodate many probes. It is also an object of the present invention to provide a semiconductor device manufacturing method using such a testing apparatus.

To attain the above and other objects, the invention provides the following semiconductor device testing apparatuses and semiconductor device manufacturing methods.

A first testing apparatus having probes to be brought into contact with electrodes of said semiconductor device as a test, comprises: a plurality of beams supported by support portions of a silicon substrate, wherein said probes are formed on said beams; and wiring lines connecting said probes to secondary electrodes formed on said silicon substrate, wherein said probes are located between electrodes and an end of the wiring lines.

A second testing means for testing a semiconductor device, comprises: a plurality of cantilevers that are supported by support portions of a substrate; contacting means formed on said cantilevers for contacting with electrodes of said semiconductor device as a test subject; electrical connecting means for connecting said contacting means to secondary electrodes formed on said substrate via a face of a base portion of said cantilevers; and support means for supporting of deformation of the cantilever formed on the other side of said cantilevers and extending at least at the base portion of the cantilevers.

In the second testing apparatus, the support means may be made of the electrical connecting means.

In the first to second testing apparatuses, for example, the following features are available.

In the case of using double-support beams, at first, the wiring lines can be formed on the double-support beam and can extend from the both sides of the probe on a face of the probe where the wiring lines are formed.

In addition, the wiring lines can be formed on a face of the double-support beam where the probe is formed, so as to extend to the two support portions at both ends of the beam.

In the case of using cantilevers, at first, the wiring lines can connect the probes to secondary electrodes formed on the substrate and can be formed on a front face and a back face of the cantilever where the probes are formed.

Secondly, the wiring lines can connect the probes to secondary electrodes formed on the silicon substrate via a back face of the probes of the cantilevers and can extend from the cantilever to the support portion on a front face of the probes of the of cantilevers.

Thirdly, the wiring lines can extend from a front face of the cantilever where the probe is formed to the secondary electrode via a back face of the cantilever, and can extend at least to the support portion of the associated cantilever on the front face of the cantilever.

Each probe formed on the beam or cantilever may be distanced from the next probe formed on an adjacent beam by 100 (m or less.

A first semiconductor device manufacturing method according to the invention comprises: a test process including at least one of a characteristics test process; an initial defect accelerated selection test process; and a final performance test process that are to be executed on LSIs formed on a wafer or individual LSIs obtained by cutting a wafer. The test process is executed by using a testing apparatus comprising: a plurality of beams supported by support portions of a substrate; probes formed on the cantilevers to be brought into contact with electrodes of the semiconductor device as a test subject; and lines connecting the probes to electrodes formed on the silicon substrate, wherein the probes are located at between electrodes and an end of the lines.

In the semiconductor device manufacturing method, at first, a plurality of double-support beams are supported by support portions of a silicon substrate, probes may be formed on the beams to be brought into contact with electrodes of an LSI as a test subject, and wiring lines may connect the probes to secondary electrodes formed on the silicon substrate, wherein the wiring lines may be formed on a face of the double-support beam where the probe is formed and may extend to the two support portions at both ends of the beam.

Secondly, a plurality of cantilevers are supported by support portions of a silicon substrate, probes may be formed on the cantilevers and to be brought into contact with electrodes of the semiconductor device as a test subject, and lines may connect the probes to secondary electrodes formed on the silicon substrate via a back face of facing LSIs of the cantilever, wherein the lines may extend from the cantilever to the support portion of a front face of the probes.

Where each wiring line is formed on the surface of the associated double-support beam where the associated probe is formed, so as to extend at both sides of the probe on a front face where the probe is placed on the beam, especially, so as to extend to the two support portions at both ends of the beam, the beam always has the same sectional shape taken in the width direction at any arbitrary position in the longitudinal direction of the beam. As a result, the second moment of area that is determined by the shapes of the beam and the wiring line is made constant. This prevents a problem that the curvature of the beam varies locally when the beam is brought into contact with a subject body, and is thereby bent by a prescribed amount.

As a result, local concentration of stress in the beams is prevented and problems such as breakage of a beam can be avoided.

Where each wiring line is formed on the surface of the associated cantilever where the associated probe is formed, so as to extend at least to the support portion of the associated cantilever, the neutral axis is shifted, and the distance between the neutral axis and a portion of the support portion of the cantilever where the tensile stress is strong becomes smaller.

Since the stress is reduced, a semiconductor device testing apparatus can be realized that can be miniaturized while the strength of cantilevers is kept at a required level and that, hence, can accommodate many probes.

Where a line and support member are formed on a cantilever to the support portion on a front face of the probe, they provide support for deformation of the beam, which can arise in testing process.

DESCRIPTION OF THE PREFERRED EMBODIMENTS

Embodiments of the present invention will be hereinafter described with reference to the accompanying drawings.

First, the first embodiment of the invention will be described with reference to FIG. 1 and FIGS. 2A and 2B.

Figure 1:
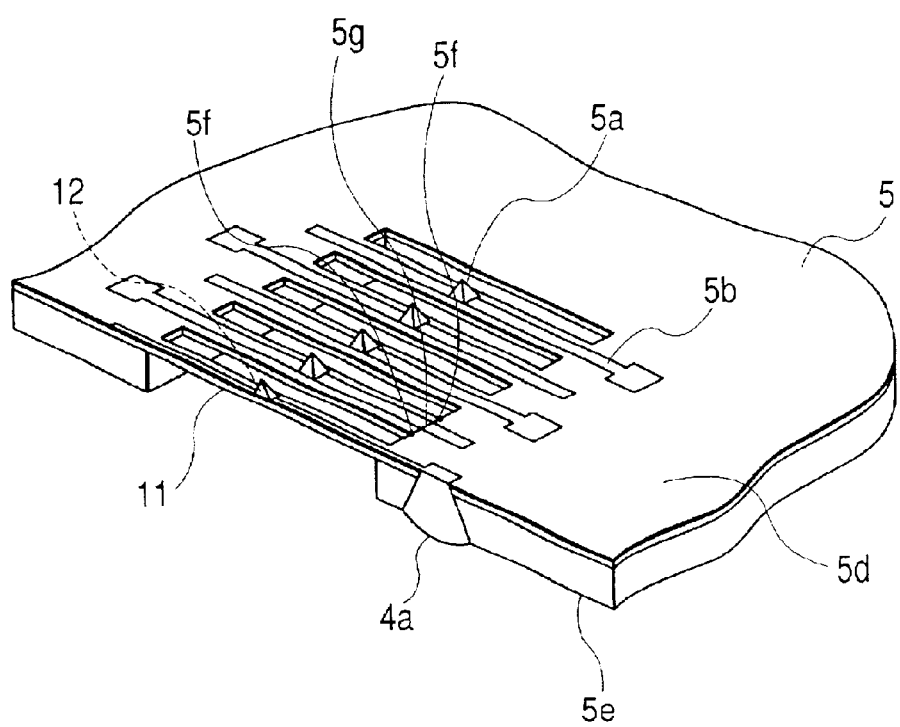
FIG. 1 is an enlarged perspective view of the main part of a semiconductor device testing apparatus according to a first embodiment of the present invention.

FIG. 1 is an enlarged perspective view of the main part of a semiconductor device testing apparatus according to the first embodiment of the invention, that is, a perspective view of the main part of a substrate 5 that is part of a probe structure, and in which probes are formed. FIG. 2A is a sectional view of part of the probe formation substrate 5 of FIG. 1, taken along the longitudinal direction of a beam 11. FIG. 2B is a plan view of part of the probe formation substrate 5 of FIG. 1, as viewed from the side of a probe formation surface 5d.

In the first embodiment of the invention, by using an etching technique, a plurality of beams 11 (in the example of FIG. 1, double-support beams, that is, beams supported on both ends) and projections 12 are formed integrally, and through-holes 4a are formed in the probe formation substrate 5 that is mainly made of Si. Then, the surface layers of the projections 12 are metallized to render those conductive, whereby probes 5a are formed.

Further, lines 5b are formed to electrically connect the probes 5a to secondary electrodes (not shown) to be formed on a surface 5e opposite to the probe formation surface 5d. Usually, for example, the lines 5b are made of Cu (copper) having small volume resistivity, Ni (nickel) that is superior in wear resistance and plating performance, Rh (rhodium), or Au (gold), or have a lamination structure of those materials. In the first embodiment of the invention, each line 5b electrically connects the two surfaces of the beam 11 by extending through the through-hole 4a.

Each line 5b also extends in the direction that is electrically irrelevant to the direction in which the line 5b extends to obtain the above-mentioned electrical connection between the two surfaces of the beam 11. That is, each line 5b also extends in the direction opposite to the direction from the probe 5a to the through-hole 4a. And each line 5b extends past a straight line 5g that connects two points 5f in a base portion of the beam 11. That portion of each line 5b, which is located on the other side of the straight line 5g, will be hereinafter referred to as "overlap".

With the above measure, each beam 11 has the same sectional shape, taken in the width direction at an arbitrary position in the longitudinal direction of the beam 11, as a result of which the second moment of area, which is determined by the shapes of the beam 11 and the line 5b, is uniform. Therefore, this prevents a problem that the curvature of the beam 11 varies locally when the beam 11 is bent by a prescribed amount due to contact of the probe 5a with a pad of a subject body (not shown).

This, in turn, prevents local concentration of stress in the beams 11, and thereby prevents problems such as breakage of a beam 11. These undesirable phenomena are in themselves not serious in connection with the strength-related properties of Si, as long as the pitch of the pads of a subject body is sufficiently long, for example, longer than 100 (m.

Therefore, the first embodiment of the invention is effective when the subject body is a very high density LSI in which the pitch of the pads is 100 (m or less.

Figure 2A:
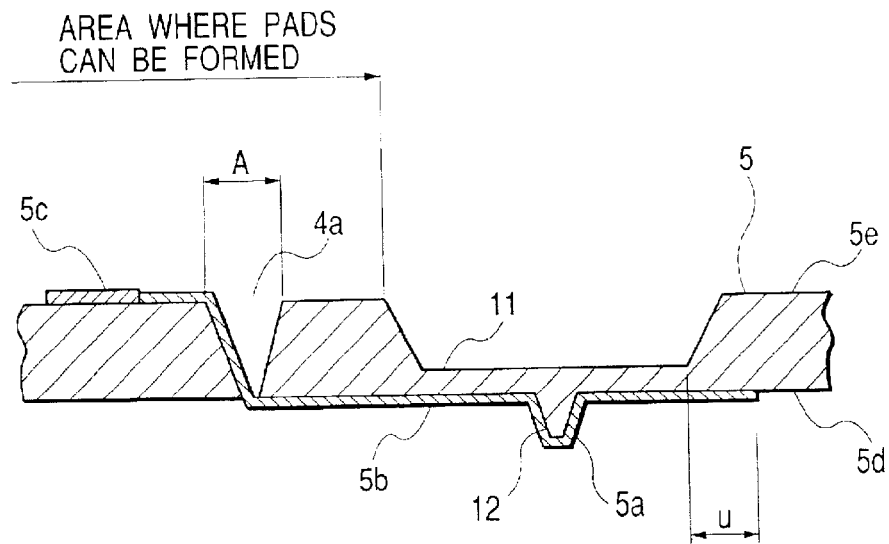
FIG. 2A is a sectional view of part of a probe formation substrate shown in FIG. 1 taken along the longitudinal direction of a beam.

Usually, it is preferable that the overlap length, that is shown by a value u, in FIG. 2A, be in a range of tens of micrometers to hundreds of micrometers. This is because of the following two reasons. First, the above-described effect is not necessarily proportional to the overlap length u, but reaches a saturation point after the value u passes a certain value. Second, if the overlap length u is made too long, the capacitance that depends on the area where the line 5b coexists with the probe formation substrate 5 becomes unduly large and impairs the electrical characteristics of the probe.

In the first embodiment of the invention, the secondary electrodes 5c are formed on the surface 5e of the probe formation substrate 5 which is opposite to the probe formation surface 5d. This measure is taken in consideration of convenience in connecting, mechanically and electrically, the structure of the first embodiment of the invention to a prescribed printed wiring board (not shown) or the like, that is, in assembling a probe structure. This measure is indispensable in obtaining a probe structure in which many probes are arranged at a small pitch. For the same reason, the through-holes 4a are formed in substantially the same plane.

Figure 2B:
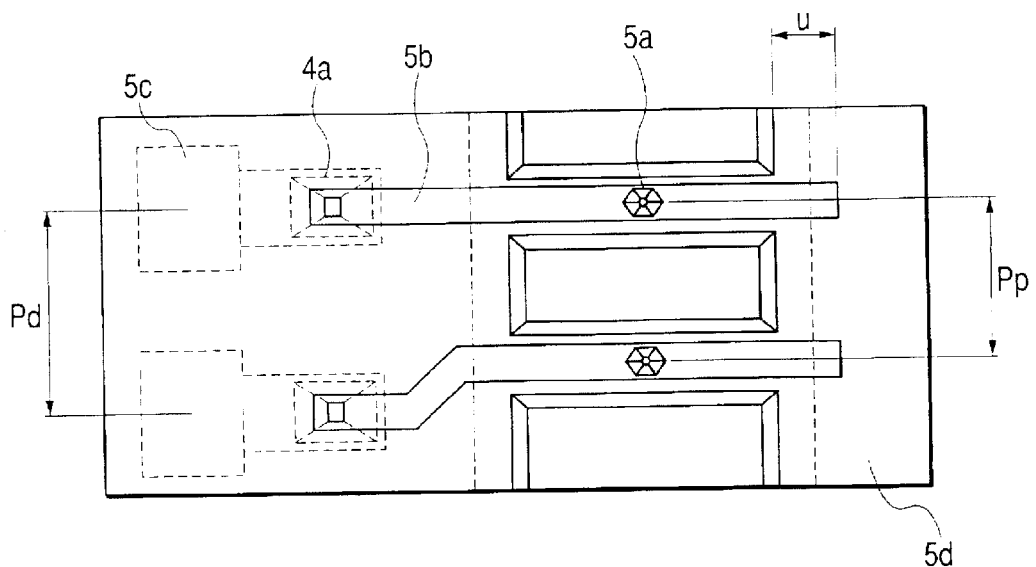
FIG. 2B is a plan view of part of the probe formation substrate shown in FIG. 1, as viewed from the side of a probe formation surface.

As shown in FIG. 2B, a pitch Pp between adjacent probes 5a is different from a pitch Pd between adjacent secondary electrodes 5c. One of the main purposes of the first embodiment of the invention is to make the probes 5a smaller than in the conventional cases. Equalizing the pitches of the probes 5a and the secondary electrodes 5c may complete assembly of a probe structure (described above).

Therefore, making the pitches or layouts of the probes 5a and the secondary electrodes 5c is a measure that is also indispensable in obtaining a probe structure in which many probes are arranged at a small pitch.

As described above, according to the first embodiment of the invention, since each line 5b is formed on one surface of the beam 11 at a uniform width over the entire length of the beam 11 (formed at least in both end support portions of the beam 11), the beam has the same sectional shape taken in the width direction at an arbitrary longitudinal direction of the beam 11.

As a result, the second moment of area is uniform that is determined by the shapes of the beam 11 and the line 5b. This prevents the problem that the curvature of the beam 11 varies locally when the beam 11 is bent by a prescribed amount due to contact of the probe 5a with a pad of a subject body. This in turn prevents local concentration of stress in the beams 11 and thereby prevents problems such as breakage of a beam 11.

Therefore, the probe structure can be miniaturized while the strength of the beams is kept at a required level, whereby a semiconductor device testing apparatus capable of accommodating many probes can be realized.

Figure 15:
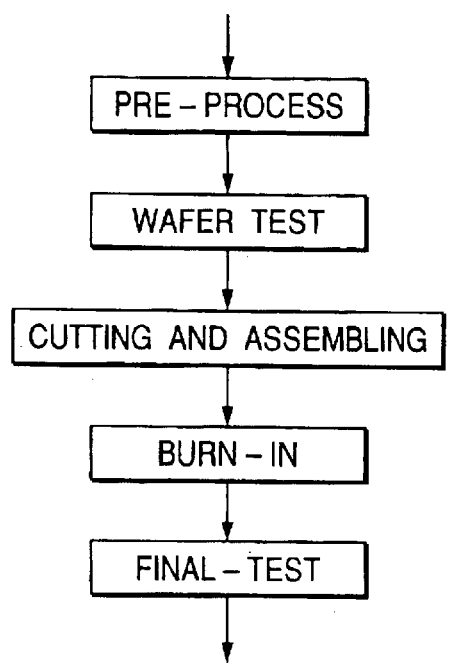
FIG. 15 is a flowchart outlining a manufacturing method of a semiconductor device.
Figure 16:
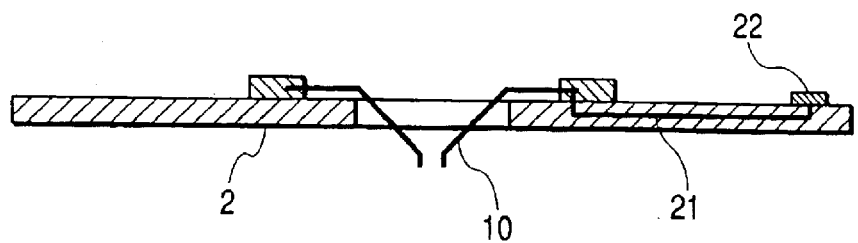
FIG. 16 is a schematic sectional view of a conventional probe structure.
Figure 17:
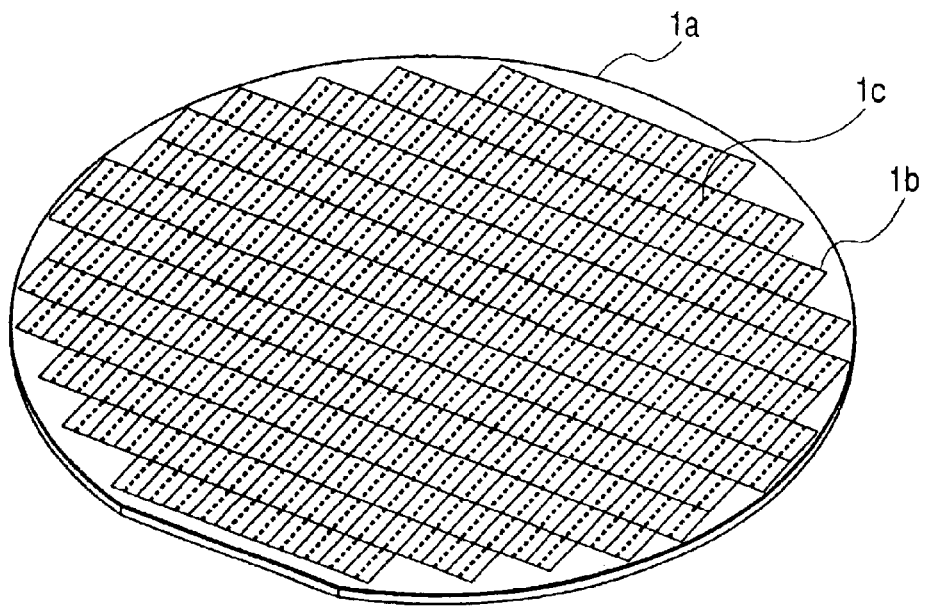
FIG. 17 is a perspective view showing a wafer appearance that shows how LSIs are formed on the wafer.
Figure 18:
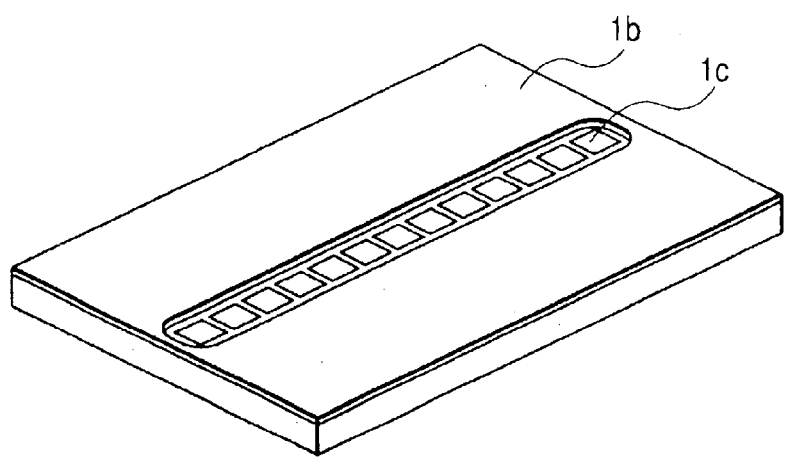
FIG. 18 is an enlarged perspective view showing an appearance of one of the LSIs 1b shown in FIG. 17.

By using the semiconductor device testing apparatus according to the first embodiment of the invention, in the wafer test process of the semiconductor device manufacturing process shown in FIG. 15, more LSIs can be tested than in the conventional cases and, hence, a semiconductor device manufacturing method that is increased in test efficiency can be realized.

Next, the second embodiment of the invention will be described with reference to FIGS. 3 and 4.

Figure 3:
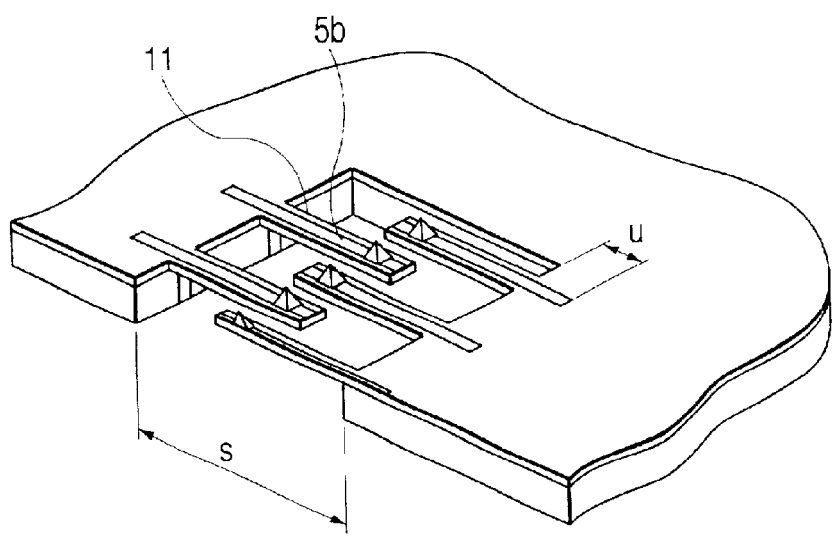
FIG. 3 is an enlarged perspective view of the main part of a semiconductor device testing apparatus according to a second embodiment of the invention.

FIG. 3 is an enlarged perspective view of the main part of a semiconductor device testing apparatus according to the second embodiment of the invention, that is, a perspective view of the main part of a substrate 5 that is part of a probe structure, and in which probes are formed. FIG. 4 is a sectional view of part of the probe formation substrate 5 of FIG. 3 taken along the longitudinal direction of a beam 11.

In the second embodiment of the invention, the beams 11 are cantilevers rather than double-support beams as employed in the first embodiment. Part of each line 5b extends on a side surface 111 of the beam 11, that is, a surface connected to a surface 5d where probes 5a are formed, and is connected to a secondary electrode 5c. In the probe formation surface 5d, each line 5b extends to the base portion of the beam 11 and forms an overlap having a value u in the same manner as in the first embodiment.

Figure 13:
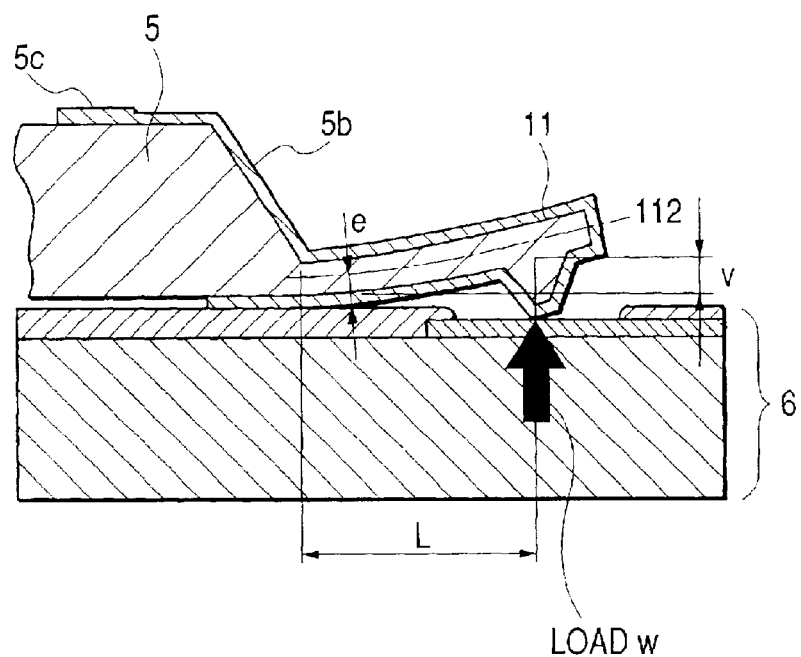
FIG. 13 is a sectional view showing a state in which the probe formation substrate, according to the second embodiment of the invention, is pressed against a prescribed portion of a subject body.
Figure 14:
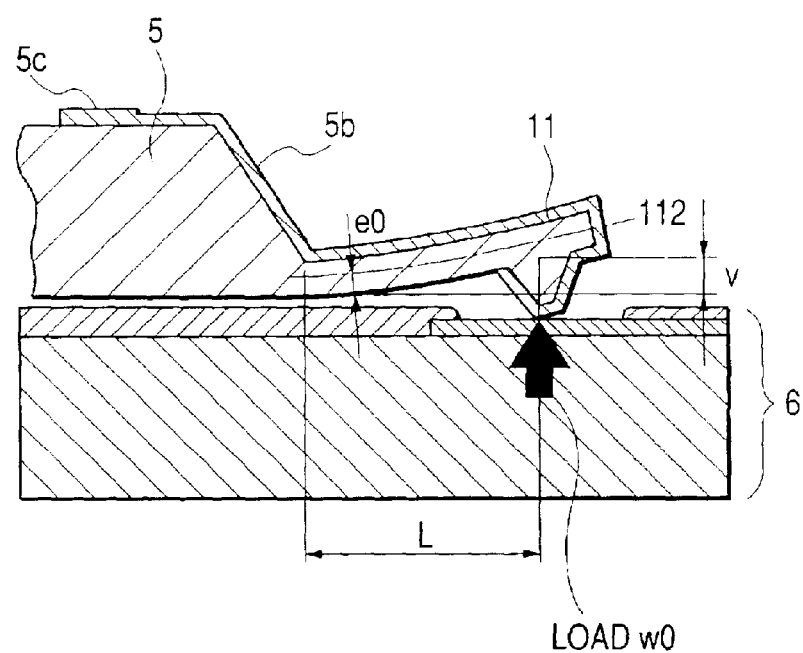
FIG. 14 is a sectional view showing a state in which a conventional probe formation substrate is pressed against a prescribed portion of a subject body.

A first effect of the second embodiment of the invention will be described with reference to FIGS. 13 and 14. FIG. 13 is a sectional view showing a state in which the probe formation substrate 5, according to the second embodiment of the invention, is pressed against a prescribed portion of a subject body 6. FIG. 14 is a sectional view of a similar state in a case where the line 5b does not extend in the above-described manner.

When the beam 11 is bent as shown in FIG. 14, a neutral axis 112 where the bending stress in the beam 11 is equal to 0 is determined based on the beam structure, and a distance e0 from the neutral axis 112 to the bottom surface of the beam 112 is defined, as shown in FIG. 14.

Since the distance e0 is proportional to the stress occurring in the beam 11, the stress in the beam 11 can be reduced by decreasing the distance e0.

Such a measure is taken in the example of FIG. 13, that is, the second embodiment of the invention. Specifically, the part of each line 5b which is irrelevant to its electrical characteristics is formed on the bottom surface of the beam 11. As a result, the sectional shape including the line 5b and the Si portion is made different than in the example shown in FIG. 14, and the neutral axis 112 moves downward compared to FIG. 14, whereby a distance e, shown in FIG. 13, becomes shorter than the distance e0 shown in FIG. 14.

As a result, if a bending amount v in the example of FIG. 13 is the same as that in the example of FIG. 14, the stress in the former is weaker than in the latter. In other words, if the dimensions of the beam 11 in the example of FIG. 13 are the same as in the example of FIG. 14, the beam 11 can be bent to a greater extent in the former than in the latter.

A second effect of the second embodiment of the invention is as follows. In the structure of FIG. 13, since the line 5b is formed on both the top and bottom surfaces of the beam 11, the line 5b adds to the rigidity of the beam 11. As a result, with the same bending amount v, the second embodiment can produce a heavier load w than in the example of FIG. 14. That is, a relationship w>w0 is obtained where w and w0 are the loads occurring in the examples of FIGS. 13 and 14, respectively.

A third effect of the second embodiment of the invention is as follows. Employing the cantilever structure, the example of FIG. 13 can make the length of the beam 11 for producing the same load much shorter than that in the first embodiment which employs the double-support beams as shown in FIG. 1 and FIGS. 2A and 2B.

This leads to a reduction of the beam formation area (indicated by character S in FIG. 3) of the probe formation substrate 5, which in turn makes it possible to secure a larger area in which to form the secondary electrodes 5c. As a result, the secondary electrodes 5c can be formed with large margins in pitch and size.

As described above, according to the second embodiment of the invention, since a part of each line 5b which is irrelevant to its electrical characteristics is formed on the bottom surface of the beam 11, the neutral axis 112 is moved and the distance e is decreased.

As a result, if the bending amount v in the example of FIG. 13 is the same as in the example of FIG. 14, the stress in the former is made weaker than in the latter.

Therefore, the probe structure can be miniaturized while the strength of the beams is kept at a required level, whereby a semiconductor device testing apparatus capable of accommodating many probes can be realized. Further, a semiconductor device manufacturing method that is increased in test efficiency can be realized.

The third embodiment of the invention will be described with reference to FIGS. 5 and 6.

Figure 5:
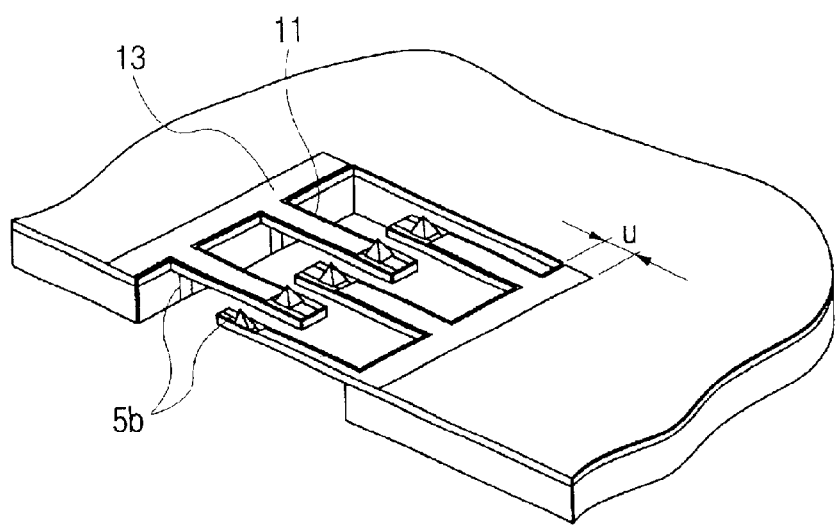
FIG. 5 is an enlarged perspective view of the main part of a semiconductor device testing apparatus according to a third embodiment of the invention.
Figure 6:
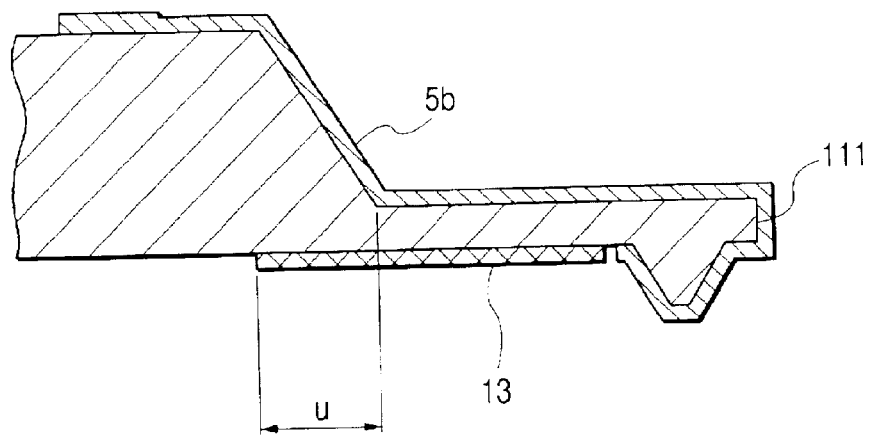
FIG. 6 is a sectional view of part of a probe formation substrate shown in FIG. 5, taken along the longitudinal direction of a beam.

FIG. 5 is an enlarged perspective view of the main part of a semiconductor device testing apparatus according to the third embodiment of the invention, that is, a perspective view of the main part of a substrate 5 that is part of a probe structure, and in which probes are formed. FIG. 6 is a sectional view of part of the probe formation substrate 5 of FIG. 5, taken along the longitudinal direction of a beam 11.

In the third embodiment of the invention, unlike the case of the second embodiment, each line 5b is formed along the minimum path that is necessary to secure the electrical characteristics required. To attain the same effects as in the second embodiment, a film 13 is formed on the bottom surface of each beam 11 separately from the line 5b.

In the above-described second embodiment, each line 5b itself is used to improve the bending characteristic of the beam 11. However, this design increases the formation area of each line 5b, and hence may make the capacitance formed by each line 5b and the probe formation substrate 5 unduly large, thereby deteriorating the electrical characteristics of the probe structure.

The third embodiment of the invention is intended to solve the above problem. The above problem can be solved because the film 13 is a separate member from the line 5b. Usually, the film 13 is a metal plating film, a thermosetting resin film, or the like. Although usually the film 13 is so formed as to have the same thickness as the line 5b, the invention is not limited to such a case. The upper limit thickness value of the film 13 is set at such a value that the beam 11 is bent by a prescribed amount within a prescribed allowance range when the beam 11 is pressed against a prescribed subject body.

In addition to the same advantages obtained by the second embodiment, the third embodiment provides additional advantages such that the probe structure can be miniaturized while the strength of the beams is kept at a required level without deteriorating the electrical characteristics. Thus, a semiconductor device testing apparatus capable of accommodating many probes can be realized.

The film 13 provides the advantages over the conventional case as long as it is formed in the support portion of the beam 11 and its vicinity.

A designing method and advantage of the probe according to the invention will be described below with reference to FIGS. 7–10.

Figure 4:
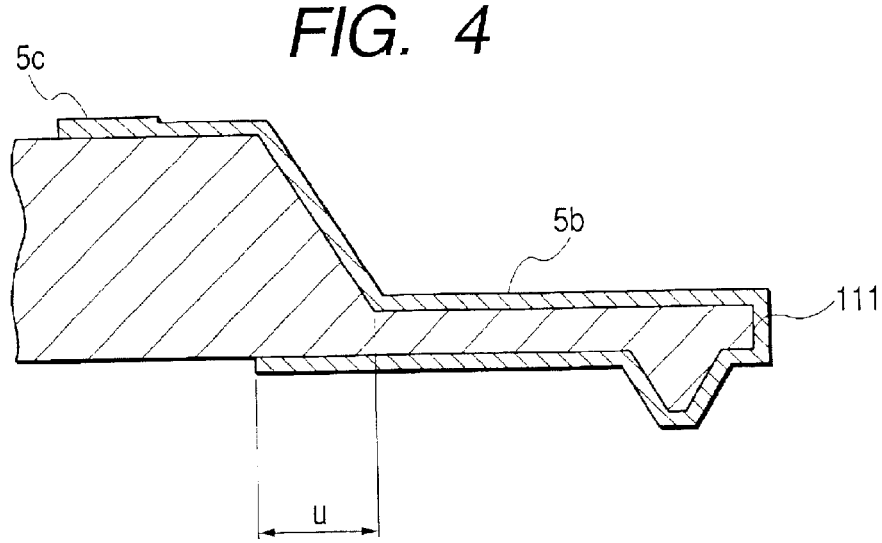
FIG. 4 is a sectional view of part of a probe formation substrate shown in FIG. 3, taken along the longitudinal direction of a beam.
Figure 7:
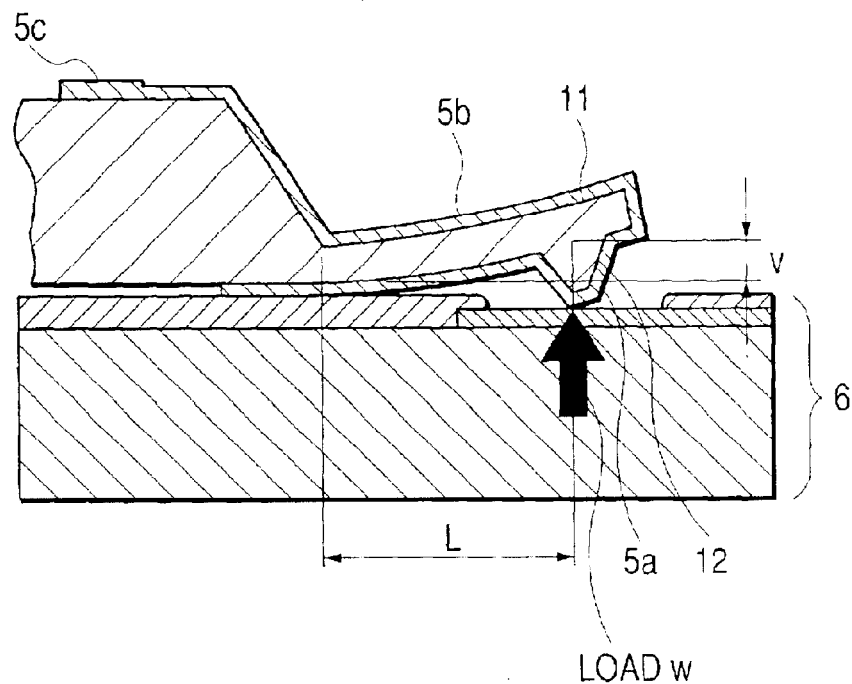
FIG. 7 is a sectional view showing a state in which the probe shown in FIG. 4, according to the second embodiment of the invention, is brought into contact with a pad of a prescribed subject body.
Figure 8:
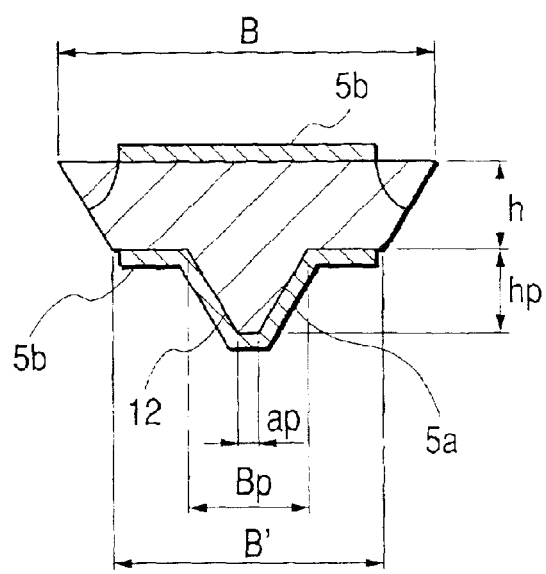
FIG. 8 is a sectional view, taken in the width direction, of a portion of the beam including a projection.

FIG. 7 is a sectional view showing a state in which the probe 5a, shown in FIG. 4 according to the second embodiment of the invention, is brought into contact with a pad of a prescribed subject body 6. FIG. 8 is a sectional view, taken in the width direction, of a portion of the beam 11 including the projection 12.

Figure 9A:
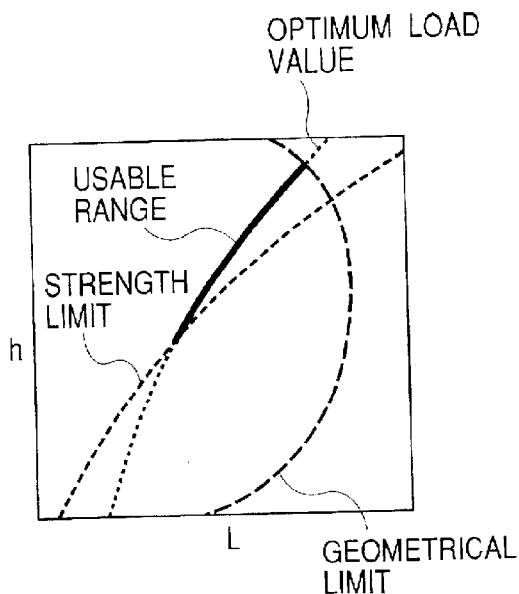
FIGS. 9A and 9B are charts showing proper ranges of two dimensions of the beam.
Figure 9B:
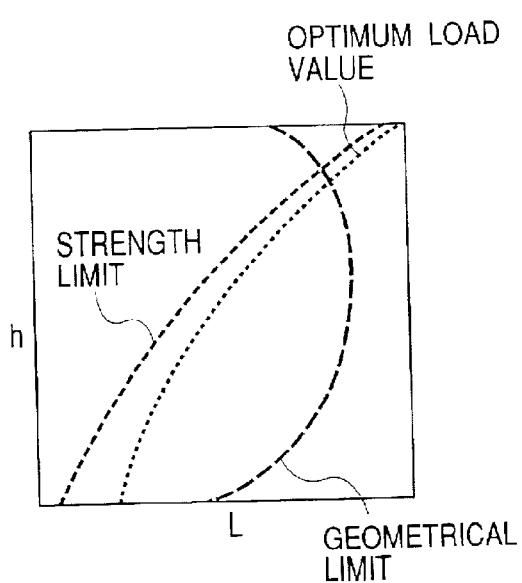
Figure 10:
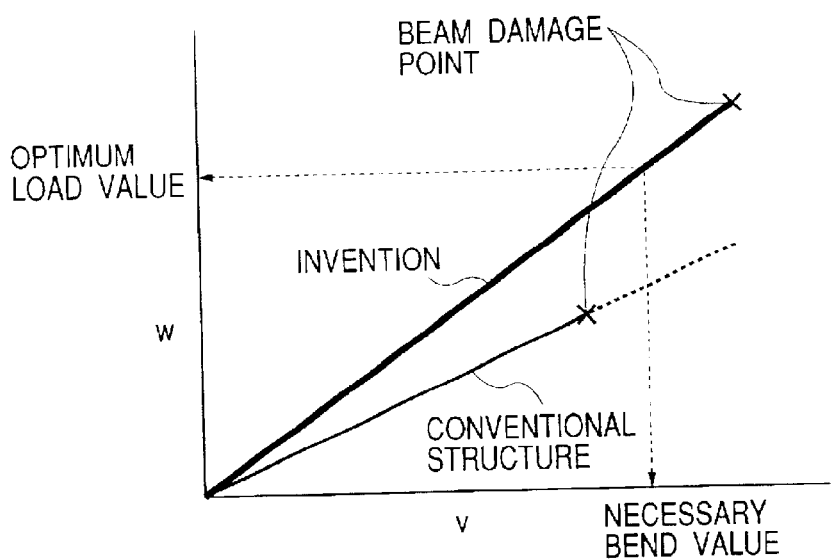
FIG. 10 shows a relationship between the bend of the beam and the load in which the invention is compared with a conventional example.

FIGS. 9A and 9B are charts showing proper ranges of two dimensions of the beam 11; FIG. 9A corresponding to the invention and FIG. 9B corresponding to the conventional case. FIG. 10 shows a relationship between the bend of the beam 11 and the load in which the invention is compared with the conventional example.

In designing the beam 11, it is necessary to determine the length L, width B, and thickness h. With an assumption that the beam 11 is bent by a bend amount v, the values of these parameters are determined so as to satisfy conditions that the beam 11 can produce a load w that is necessary for conduction between the probe 5a and the pad 1c, and that the beam 11 is not damaged by an unduly large stress.

To reduce the contact resistance between the probe 5a and the pad 1c, the shape of the line 5b is also important. Forming a thick line 5b is effective in decreasing the wiring resistance or increasing the rigidity of the entire beam. However, if the line 5b on the projection 12 is too thick, the final shape of the projection 12, that is, the outermost shape of the line 5b, becomes obtuse, increasing the load that is necessary for electrical connection to the pad 1c.

To reduce the wiring resistance, it is also effective to increase the width of the line 5b. However, if the line 5b is made too wide, the above-mentioned capacitance increases and deteriorates the electrical characteristics.

Where the layout pitch of the pads of a subject body is as small as 100 (m or less, for example, the width B of the beam 11 is necessarily limited to a value smaller than or equal to the pad layout pitch. Therefore, the above mechanical characteristics need to be satisfied by the other parameters, that is, the length L and the thickness h.

FIG. 9 shows how to satisfy the mechanical characteristics as well as showing an advantage of the invention.

FIG. 9A shows mechanical characteristics of the beam 11 according to the invention, and FIG. 9B shows those of the conventional example. Dotted lines both FIGS. 9A and 9B are contour lines for the length L and the thickness h of each beam 11 that indicate optimum load values, strength limits of the beam 11, and geometrical limits of effective sectional shapes of the beam 11 (the projection height that is determined by the bend v is taken into consideration) in a case where the width B of the beam 11 is set at and fixed to a value suitable for a layout of a very small pitch, and the bend v is set at a constant value.

First, in FIG. 9A, both the strength-related requirements and the geometrical requirements are satisfied in a range on the left (top-left) of the dotted lines indicating the strength limits and the geometrical limits. A range of combinations of the length L and the thickness h that satisfy the optimum load values is indicated by a thick solid line that is part of the dotted line indicating the optimum load values.

As described above, for the formation of small-pitch probes, the length L and the thickness h cannot take arbitrary values and are instead limited to very narrow ranges. The designing of the dimensions of the beam 11 should be performed carefully in this respect. Usable ranges are secured in the case of the invention.

Usually, in consideration of dimensional errors in actual probe structures, it is preferable to employ the values of the top end of the thick solid line range in FIG. 9A. The top end point, which is most distant from the strength limit line, provides the largest margin in strength.

On the other hand, in FIG. 9B, as in the case of FIG. 9A, both the strength-related requirements and the geometrical requirements are satisfied in a range on the left (top-left) of the dotted lines indicating the strength limits and the geometrical limits. However, the dotted line indicating the optimum load values is always out of the range where the strength-related requirements are satisfied.

This means that the conventional example cannot secure usable ranges of the length L and the thickness h; that is, beams that are formed to satisfy an optimum load value are necessarily damaged, and hence cannot constitute an effective probe structure.

FIG. 10 shows actual measurement results of the relationship between the bend v and the load w that were obtained by producing probe structures actually based on the above discussions. In both the invention and the conventional example, the relationship between the bend v and the load w was approximately linear to a point where the beam 11 was broken.

However, in the conventional example, the slope was such that the load w was smaller than an optimum value, even at a necessary value of the bend v of the beam 11. The beam was damaged before the bend v reached the necessary value.

On the other hand, in the invention, the necessary value of the bend v was reached before the beam 11 was damaged. Significant differences between the invention and the conventional example and the advantages of the invention have thus been verified.

Other embodiments of the invention will be described below with reference to FIGS. 11 and 12.

Figure 11:
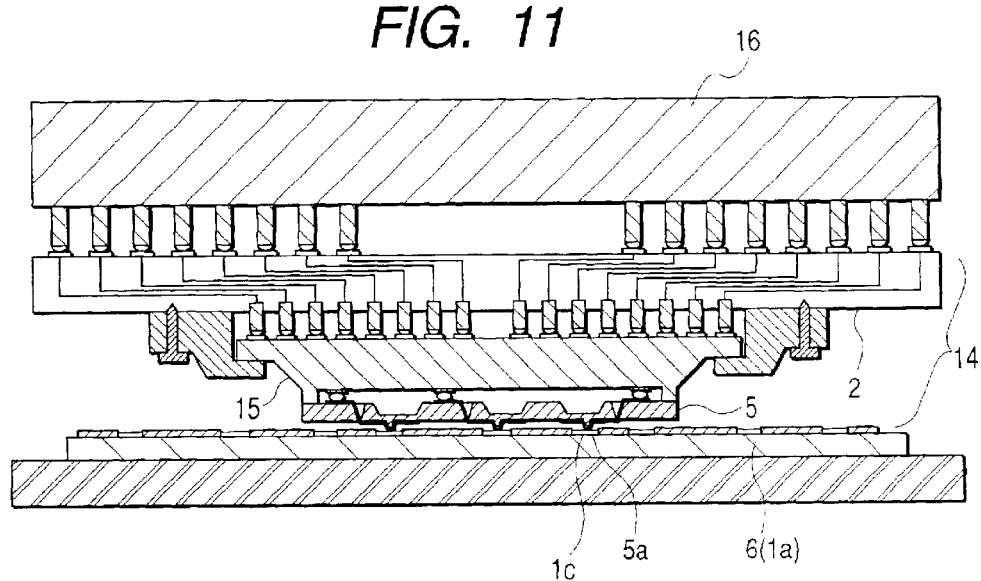
FIG. 11 is a schematic sectional view of a probe structure formed by using any of the above-described probe formation substrates, according to the first to third embodiments of the invention.

FIG. 11 is a schematic sectional view of a probe structure formed by using any of the above-described probe formation substrates. FIG. 12 is a perspective view of a probe structure 14 as a probe card that is used in a wafer test.

The probe structure 14 is configured in such a manner that the secondary electrodes 5c of the probe formation substrate 5 are connected mechanically and electrically, with solder, conductive resin, or the like, to an interposer 15 that is formed, on one surface, with electrodes at positions corresponding to the respective secondary electrodes 5c, and the other surface of the interposer 15 is connected to a printed wiring board 2.

Electrodes formed on the topmost surface (as viewed in FIG. 11) of the printed wiring board 2 are mechanically and electrically connected to an external system 16. In this state, the probes 5a are brought into contact with prescribed pads 1c of a wafer 1a, whereby the wafer 1a is electrically connected to the external system 16. A wafer test is conducted according to a prescribed program.

Figure 12:
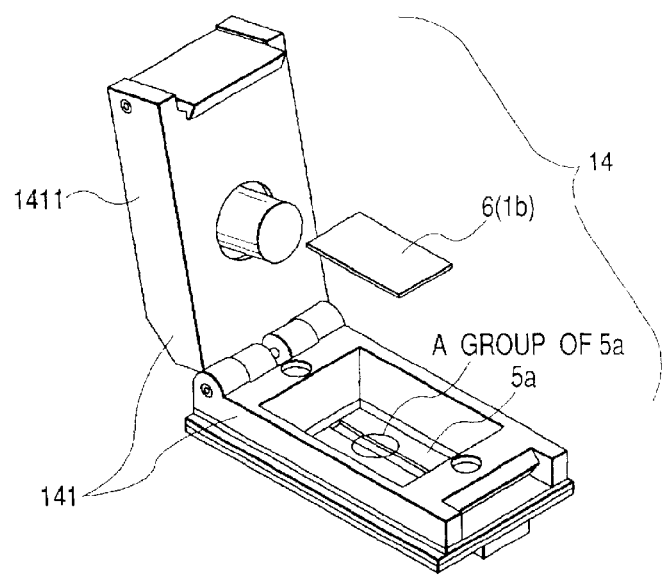
FIG. 12 is a perspective view of a probe structure formed by using any of the above-described probe formation substrates, according to the first to third embodiments of the invention.

FIG. 12 shows a probe structure as a shell that is used in performing burn-in and a selection test on a subject body such as cut-out LSIs. In the probe structure 14, the probe formation substrate 5 is incorporated in a shell 141 in such a manner that the probes 5a are directed upward (as viewed in FIG. 12) and exposed to the outside.

When a LSI 1b is set face-down (as viewed in FIG. 12) and a lid 1411 is closed (packing), prescribed pressure occurs between the probes 5a and the LSI 1b. In this state, the probe structure is used for burn-in and a selection test as a quasi-package (body) for which, unlike LSIs, great care need not be taken regarding environmental conditions and handling.

By attaching the above body to a socket as described in the background section, burn-in and a selection test can be performed on even what is called a bare chip that has not been subjected to an assembling process in the same manner as is done on a conventional, assembled semiconductor device. This is impossible in the prior art.

According to the invention, the probe structure can be miniaturized while the strength of the beams is kept at a necessary level, whereby a semiconductor device testing apparatus capable of accommodating many probes can be realized.

By using the semiconductor device testing apparatus according to the invention in a test process, a semiconductor device manufacturing method that is increased in test efficiency can be realized.

More specifically, even if the beam dimensions are made smaller than in the conventional cases, a problem does not occur that a beam is damaged when bent by a prescribed amount, and a necessary load value can be secured. Therefore, a probe structure can be constructed that can deal with subject bodies having a high-density pad layout.

Since the beam formation area can be reduced, the freedom of designing to the layout and dimensions of the secondary electrodes in the probe formation substrate is increased and more probes can be formed. Therefore, more LSIs on a wafer can be tested simultaneously. Hence, test efficiency can be increased.

We claim:

1. A testing apparatus having probes to be brought into contact with electrodes of a semiconductor device as a test, comprising:
    a plurality of double-support beams supported by support portions of a substrate, wherein said probes are formed on said beams; and
    first lines to connect said probes to secondary electrodes formed on said substrate and second lines to connect said beams to said support portions, wherein said first and second lines are formed on said beams,
    wherein said first lines are formed on said substrate and are extended through through-holes formed in said support portions to connect said probes to said secondary electrodes, and said first and second lines are formed on faces of said beams when said probes are formed.

2. The testing apparatus according to claim 1;
    wherein each said probe formed on one of said beams is distanced from and adjacent probe formed on an adjacent beam by 100 μm or less.

3. A testing apparatus according to claim 1, wherein said beams are double-support beams, said first lines are located on a first side of said probes, and said second lines are located on another side of said probes on a front face of said double-support beams.

4. A testing apparatus according to claim 1, wherein said secondary electrodes are formed on said substrate to face in a direction opposite to said faces of said beams where said probes are formed.

5. A testing apparatus having probes to be brought into contact with electrodes of said semiconductor device as a test, comprising:
    a plurality of double-support beams that are supported by support portions of a substrate, wherein said probes are formed on said beams; and
    lines to connect said probes to secondary electrodes formed on said substrate;
    wherein each said line is formed on one of said double-support beams and extends from both sides of one of said probes on a face of said beam where said probe is formed,
    wherein said lines are formed on said substrate and are extended through through-holes formed in said support portions to connect said probes to said secondary electrodes, and said lines are formed on faces of said beams when said probes are formed.

6. A testing apparatus for testing a semiconductor device, comprising:
    a plurality of double-support beams supported by support portions of a silicon substrate;
    probes that are projections formed on said beams and to be brought into contact with electrodes of said semiconductor device as a test subject; and
    wiring lines that connect said probes to secondary electrodes formed on said silicon substrate, wherein said wiring lines are formed on a face of said double-support beam where said probes are formed, so as to extend to two support portions at both ends of said beam,
    wherein said wiring lines are formed on said substrate and are extended through through-holes formed in said support portions to connect said probes to said secondary electrodes, and said wiring lines are formed on faces of said beams when said probes are formed.

7. A semiconductor device manufacturing method comprising;
    a test process including at least one of a characteristics test process;
    an initial defect accelerated selection test process; and
    a final performance test process that are to be executed on LSIs formed on a wafer or individual LSIs obtained by cutting a wafer;
    wherein said test process is executed by using a testing apparatus comprising:
    a plurality of double-support beams supported by support portions of a silicon substrate,
    probes formed on said beams and to be brought into contact with electrodes of an LSI as a test subject,
    wiring lines to connect the probes to secondary electrodes formed on said silicon substrate, wherein said wiring lines are formed on a face of said double-support beams where said probes are formed and extend to said two support portions at both ends of said beam,
    wherein said wiring lines are formed on said substrate and are extended through through-holes formed in said support portions to connect said probes to said secondary electrodes, and said wiring lines are formed on faces of said beams when said probes are formed.

* * * * *